United States Patent
Hopper et al.

(10) Patent No.: US 6,862,216 B1
(45) Date of Patent: Mar. 1, 2005

(54) NON-VOLATILE MEMORY CELL WITH GATED DIODE AND MOS TRANSISTOR AND METHOD FOR USING SUCH CELL

(75) Inventors: Peter J. Hopper, San Jose, CA (US); Yuri Mirgorodski, Sunnyvale, CA (US); Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/880,176

(22) Filed: Jun. 29, 2004

(51) Int. Cl.[7] .................... G11C 16/04; G11C 16/06
(52) U.S. Cl. ................... 365/185.05; 365/185.18; 365/185.29
(58) Field of Search ............... 365/185.05, 185.18, 365/185.29

(56) References Cited

U.S. PATENT DOCUMENTS

| | | | |
|---|---|---|---|
| 4,698,787 A | 10/1987 | Mukherjee et al. | 365/185 |
| 6,137,723 A | 10/2000 | Bergemont et al. | 365/185.18 |
| 6,282,123 B1 * | 8/2001 | Mehta | 365/185.29 |
| 6,795,348 B2 * | 9/2004 | Mihnea et al. | 365/185.18 |
| 2004/0080982 A1 | 4/2004 | Roizin | |

* cited by examiner

Primary Examiner—Trong Phan
(74) Attorney, Agent, or Firm—Girard & Equitz LLP

(57) ABSTRACT

A non-volatile memory cell including a gated diode and a single readout transistor, methods for programming and reading out such a cell, and a memory including an array of such cells. The readout transistor is an MOS transistor. The transistor and gated diode are formed in a volume of semiconductor material of one type, and share a source region, a control gate, and a floating gate. The transistor has a drain region formed of semiconductor material of one type and the diode has a drain region formed of semiconductor material of the opposite type.

31 Claims, 2 Drawing Sheets

NON-VOLATILE MEMORY CELL WITH GATED DIODE AND MOS TRANSISTOR AND METHOD FOR USING SUCH CELL

BACKGROUND OF THE INVENTION

1. Field of the Invention

The present invention pertains to non-volatile memory cells (e.g., non-volatile memory cells that include at least one MOS transistor) and to methods of programming, erasing, and reading them.

2. Description of the Related Art

The expression "PMOS transistor" herein denotes a P-channel MOSFET device. The expression "NMOS transistor" herein denotes an N-channel MOSFET device.

The term "N-well" herein denotes a well of N-type semiconductor material. The term "P-well" herein denotes a well of P-type semiconductor material.

One type of conventional non-volatile memory cell is described in U.S. Pat. No. 4,698,787, issued Oct. 6, 1987. This cell includes a single MOS transistor having a stacked gate structure. The stacked gate structure includes a control gate, a floating gate, a dielectric layer insulating the control gate from the floating gate, and additional dielectric material (gate oxide) insulating the floating gate from the transistor body. The cell is programmed by biasing the control gate, source, and drain to produce hot electrons in the body and accelerate the hot electrons across the gate oxide into the floating gate. The charge accumulated on the floating gate during programming is stored there until the cell is erased. The programmed cell is erased by biasing the control gate, source, and drain to cause electrons to move (via Fowler-Nordheim tunneling) from the floating gate to the source or drain. As an example, an implementation of the cell that includes an NMOS transistor can be programmed by holding the transistor's drain at a high potential relative to the source, and briefly holding the control gate at an even higher potential relative to the source to produce hot electrons in the body and accelerate the hot electrons across the gate oxide into the floating gate. The electrons stored in the floating gate during the programming operation increase the transistor's threshold voltage. During a readout operation, the control gate, source, and drain are biased in such a manner that significant current flows through the NMOS transistor's channel if the transistor is not programmed (or has been programmed and then erased) but no significant current flows through the transistor's channel if the transistor is programmed. Thus, the amount of channel current sensed during the readout operation indicates whether the cell is or is not programmed.

Another type of conventional non-volatile memory cell is described in U.S. Pat. No. 6,137,723, issued Oct. 24, 2000. This cell includes a transistor having a source and drain formed in a well, and a floating gate separated from the well by insulating material (gate oxide). The cell is programmed by biasing the source, drain, and well to induce avalanche breakdown, thereby producing substrate hot electrons which accelerate across the gate oxide into the floating gate. The charge accumulated on the floating gate during programming is stored there until the cell is erased. The programmed cell is erased by irradiation (using ultraviolet radiation). An implementation of the cell that includes a PMOS transistor can be programmed by grounding the well, holding the transistor's drain at a large negative potential, and either floating or grounding the source. The cell can be read by grounding the well and source, applying a read voltage to the drain, and determining whether channel current does or does not flow from the drain to the source in response to such biasing of the cell.

Another type of conventional non-volatile memory cell is described in U.S. Patent Application Publication Number US 2004/0080982, published on Apr. 29, 2004. This cell includes a PMOS transistor and an NMOS transistor whose drains are coupled together by a metal structure. The transistors share a control gate and also share a floating gate. The floating gate is insulated from the control gate and from the bodies of the transistors. The cell is programmed by biasing the sources, drains, and control gate to cause electrons (produced by band-to-band tunneling) to be injected to the floating gate. However, due to the structure of the cell of U.S. Publication No. US 2004/0080982, which requires that one transistor is implemented in N-type semiconductor material (e.g., in an N-well) and the other in P-type semiconductor material (e.g., in a P-well) with field oxide isolating one transistor from the other, an array of such cells cannot be implemented with sufficient density for many applications.

There is a need for a non-volatile memory cell that can be efficiently and rapidly programmed and erased (without drawing significant current), and can be implemented compactly so that an array of the cells can be implemented with high density (many cells per unit area).

BRIEF DESCRIPTION OF PREFERRED EMBODIMENTS

In a class of embodiments, the invention is a non-volatile memory cell that includes a single readout transistor and a gated diode. The readout transistor is an MOS transistor, and both the MOS transistor and the gated diode are formed in a volume of semiconductor material of one type. For example, the MOS transistor and gated diode are both formed in a well of N-type semiconductor material, or in a well of P-type semiconductor material. The MOS transistor and gated diode share a source region (comprising semiconductor material of one type), a control gate, and a floating gate. The transistor has a drain region (comprising semiconductor material of one type) and the diode has a drain region (comprising semiconductor material of the opposite type). The two drain regions are shorted together (connected by electrically conductive material), and thus the drain regions and conductive material that connects them are sometimes referred to collectively herein as "the" drain of the cell. Dielectric material insulates the control gate and floating gate from each other and from the body, source, and drain of the transistor and the diode. Optionally, the cell also includes an additional device or circuitry (e.g., row selection circuitry which, when the cell is coupled to a column line, is coupled between the readout transistor's channel and the column line).

In some embodiments of the inventive memory cell, the readout transistor is a PMOS transistor formed side-by-side in an N-well with a gated diode. The readout transistor and diode share a source region (formed of P+semiconductor material), a control gate, and a floating gate, and the transistor's drain region (formed of P+ semiconductor material) is coupled by metal (or other conductive material) to the diode's drain region (formed of N+ semiconductor material). In other embodiments of the inventive memory cell, the readout transistor is an NMOS transistor formed side-by-side in a P-well with a gated diode. The readout transistor and diode share a source region (of N+ semiconductor material), a control gate, and a floating gate, and the transistor's drain region (formed of N+ semiconductor material) is coupled by metal (or other conductive material) to the diode's drain (formed of P+ semiconductor material).

The memory cell is programmed by biasing the control gate, source, and drain so as to reverse bias the diode, establish fields that produce hot electrons (via the band-to-band tunneling mechanism and optionally also impact ionization) near the p-n junction of the diode, and cause electron injection across the gate oxide into the floating gate. A primary function of the gated diode is to be the source of hot electrons that result in electron injection to the floating gate during programming. The charge accumulated on the floating gate during programming is stored on the floating gate until the cell is erased. The programmed cell is erased by biasing the control gate, source, and drain to cause electrons to tunnel from the floating gate to the source or drain.

In the inventive memory cell, the readout transistor is employed to read the cell. Preferably, the cell is read by biasing the control gate, source, and drain so that the amount of current flow through the readout transistor's channel depends on whether the cell is or is not in a programmed state. The channel current through the readout transistor is then determined while the transistor is so biased.

In typical embodiments of the inventive memory cell, the programming mechanism is such that the sizes of the cell's readout transistor and gated diode elements are not critical (e.g., the design of each of the readout transistor and diode is length-independent in the sense that its length is not critical).

In preferred embodiments, the inventive non-volatile memory cell is implemented as an integrated circuit.

Another aspect of the invention is a memory including an array of cells, in which each of the cells is an embodiment of the inventive non-volatile memory cell. In preferred embodiments, the memory is implemented an integrated circuit.

Methods of programming, erasing, and reading any embodiment of the inventive non-volatile memory cell are also within the scope of the invention.

DETAILED DESCRIPTION OF PREFERRED EMBODIMENTS

Figure 1:
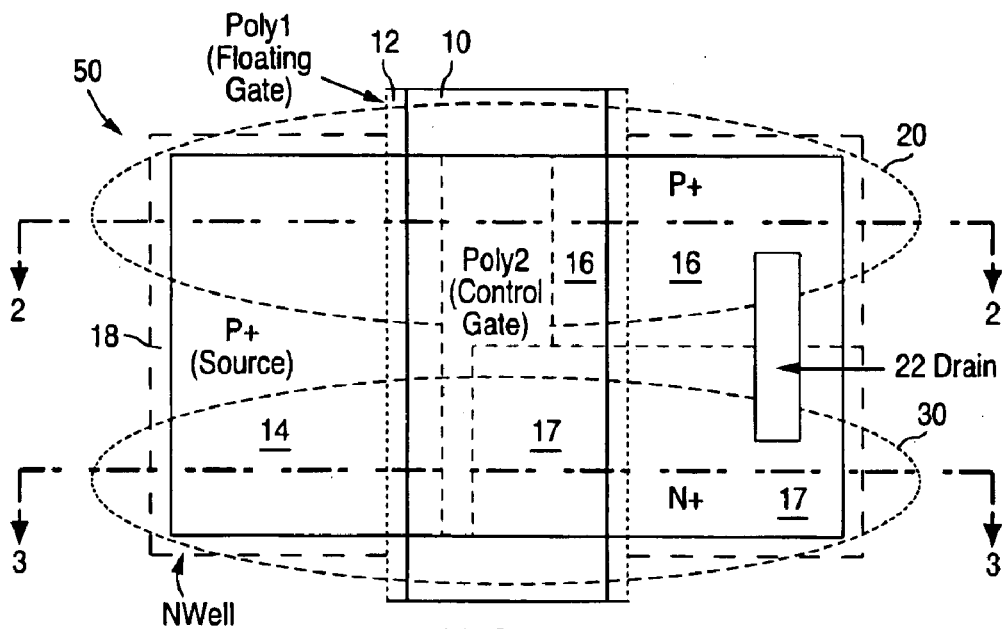
FIG. 1 is simplified top view of an embodiment of the inventive non-volatile memory cell.
Figure 2:
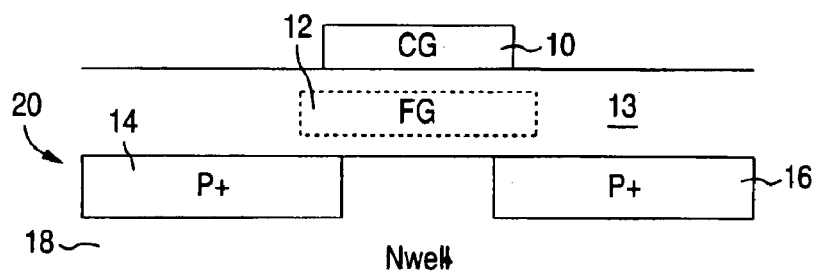
FIG. 2 is simplified side cross-sectional view of memory cell 50 of FIG. 1, taken along line 2—2 of FIG. 1.
Figure 3:
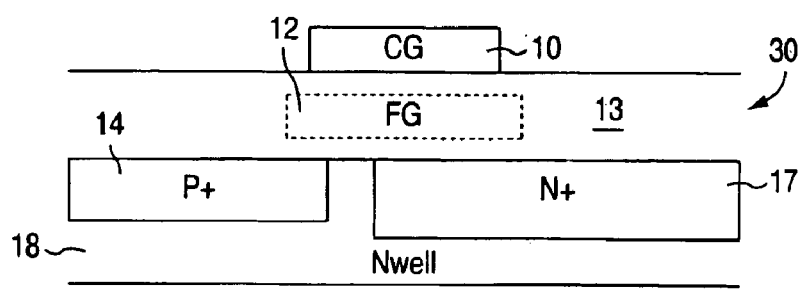
FIG. 3 is simplified side cross-sectional view of memory cell 50 of FIG. 1, taken along line 3—3 of FIG. 1.

An embodiment of the inventive non-volatile memory cell will be described with reference to FIGS. 1–3. This cell (identified in FIG. 1 as cell 50) includes PMOS transistor 20 and gated diode 30, which are formed side-by-side in well 18 of N-type semiconductor material. Transistor 20 and diode 30 share source region 14 (consisting of P+ semiconductor material), control gate 10 (formed of polysilicon), floating gate 12 (also formed of polysilicon), and gate oxide 13. Drain region 16 of transistor 20 consists of P+ semiconductor material. Drain region 17 of diode 30 consists of N+ semiconductor material. Drain regions 16 and 17 are shorted together by electrically conductive drain contact 22. Contact 22 (or regions 16 and 17 and contact 22 collectively) will sometimes be referred to collectively as cell 50's "drain." An electrically conductive source contact (not shown) is typically also coupled to source region 14. Gate oxide 13 insulates control gate 10 and floating gate 12 from each other and from well 18, source region 14, and drain regions 16 and 17.

Cell 50 is operable in programming, erase, and read modes. During programming, diode 30 functions as the main source of hot electrons that are injected to floating gate 12.

During the programming mode, biasing potentials asserted to control gate 10, source 14, and drain 22 reverse bias the diode 30 and establish electric fields that produce hot electrons (via the band-to-band tunneling mechanism) near diode 30's p-n junction (between source 14 and well 18 of diode 30) and cause injection of these electrons across gate oxide 13 into floating gate 12. For example, typical biasing potentials asserted during programming are as follows: source 14 is grounded; contact 22 is (and thus drain regions 16 and 17 are) held at a high positive voltage above ground; and control gate 10 is held at higher positive voltage above ground than are drain regions 16 and 17. For example, source 14 is grounded, contact 22 is held at 4.6 volts above ground, and control gate 10 is held at a potential in the range from 5.0 volts to 6.6 volts above ground. For another example, source 14 is grounded, contact 22 is held at a potential in the range from 4 volts to 5 volts above ground, and control gate 10 is held at a potential in the range from 5 volts to 7 volts above ground. During programming, there is very low current flow within reverse-biased diode 30 between source 14 and drain region 17 and within transistor 20 between source 14 and drain region 16. For example, during programming the current through transistor 20's channel is $I_{Dprogram}$, with $I_{Dprogram}$ satisfying $I_{Dprogram} < (ID_{on})/100$, where $I_{Don}$ is the current through transistor 20's channel when transistor is fully "on" (e.g., $I_{Dprogram} = (I_{Don})/1000$, or $I_{Dprogram} = (I_{Don})(10^{-4})$). A small current flows from source 14 to ground during programming as a result of injection (to floating gate 12) of hot electrons produced in well 18 (by band-to-band tunneling, and optionally also impact ionization) near the p-n junction between well 18 and source 14. Drain region 16 is very close to source 14, and drain region 16 is farther from source 14 than is drain region 17, and thus the strong electric field experienced by the hot electrons produced in well 18 (near to source 14) efficiently injects the electrons to floating gate 12. Transistor 20 is nearly "off" during programming in the sense that only a very small current flows between drain 16 and source 14 during programming.

The electrons accumulated on floating gate 12 during programming remain on floating gate 12 after deassertion of the programming biasing potentials from control gate 10, source 14, and contact 22. These electrons remain stored on floating gate 12 until cell 50 is erased, and cause a negative shift in floating gate 12's potential. Thus, the threshold voltage (between control gate 10 and region 14 or 16) of programmed PMOS transistor 20 is less than the threshold voltage of PMOS transistor 20 prior to programming.

Cell 50 is read by biasing control gate 10, source 14, and contact 22 so that the amount of current flowing through transistor 20's channel depends on whether cell 50 has or has not been programmed, and determining the channel current through transistor 20 while transistor 20 is so biased. For example, during read mode operation, source 14 can be grounded, contact 22 can be held at a positive voltage (typically lower than the potential above ground at which contact 22 is held during programming), and control gate 10 can be held at a voltage V satisfying $V_{tp}<V<V_{tu}$, where $V_{tu}$ is the threshold voltage (between control gate 10 and region 14 or 16) of unprogrammed transistor 20 and $V_{tp}$ is the threshold voltage (between control gate 10 and region 14 or 16) of programmed transistor 20. During a read operation (with control gate 10, source 14, and contact 22 biased as described), gated diode 30 is reverse biased, but substantial channel current flow between regions 14 and 16 of transistor 20 can be detected (e.g., by readout circuitry 210 of FIG. 4, or other readout circuitry, coupled to cell 50) if transistor 20 is in a programmed state, but no significant channel current flow between regions 14 and 16 of transistor 20 will be detected if transistor 20 has not been programmed or has been erased since undergoing programming.

In typical embodiments of the inventive cell, the programming mechanism is such that the size of the cell's elements is not critical (e.g., the design of each of transistor 20 and diode 30 in cell 50 is length-independent in the sense that their lengths are not critical. Gate oxide 13 should be thin enough to allow efficient injection of electrons to floating gate 12 during programming.

Programmed cell 50 is erased by biasing control gate 10, source 14, and contact 22 to cause electrons to tunnel from the floating gate to source 14, well 18, drain region 16, or drain region 17. For example, during erase mode operation, control gate 10 can be grounded and source 14 and contact 22 held at high potential relative to ground, so that the electric field experienced by excess electrons in floating gate 12 causes the electrons to tunnel away from floating gate 12 to region 14, 16, or 17. In one example of erase mode operation, source 14 is grounded and each of contact 22 and control gate 10 is held at a potential in the range from 8 volts to 15 volts above ground. An erase operation increases the potential of floating gate 12 and increases the threshold voltage (between control gate 10 and region 14 or 16) of transistor 20 to a value greater than the threshold voltage of programmed transistor 20.

Methods of programming, erasing, and reading any embodiment of the inventive non-volatile memory cell are also within the scope of the invention. For example, an aspect of the invention is a method for programming a non-volatile memory cell including an MOS transistor and a gated diode formed in a volume of semiconductor material of a first type, wherein the transistor and the diode share a source region, a control gate, and a floating gate, the diode has a p-n junction, the transistor has a drain region comprising semiconductor material of a second type, the diode has a drain region comprising semiconductor material of the first type, and an electrically conductive drain contact couples the drain region of the diode with the drain region of the transistor, said method including the step of biasing the control gate, the source, and the drain contact to establish electric fields that produce hot electrons near the diode's p-n junction and cause injection of said electrons into the floating gate and to reverse bias the diode.

For another example, an aspect of the invention is a method for reading a non-volatile memory cell including an MOS transistor and a gated diode formed in a volume of semiconductor material of a first type, wherein the transistor and the diode share a source region, a control gate, and a floating gate, the transistor has a drain region comprising semiconductor material of a second type, the diode has a drain region comprising semiconductor material of the first type, and an electrically conductive drain contact couples the drain region of the diode with the drain region of the transistor, said method including the step of biasing the control gate, the source, and the drain contact to cause substantial current flow through the transistor's channel if the transistor is in a programmed state but to cause no significant current flow through the channel if the transistor is not in a programmed state, and to reverse bias the diode.

Another aspect of the invention is a memory including an array of cells, wherein each cell is an embodiment of the inventive non-volatile memory cell. For example, the memory of FIG. 4 includes an M×N array of identical non-volatile memory cells, including cells 100, 101, 111, 180, 181, and 191 (and other cells not shown). In a typical implementation, each cell of the array has the same structure as cell 50 of FIGS. 1–3, except that it also includes row selection circuitry coupled between the channel of PMOS readout transistor 20 and the column line (one of lines CL1–CLM) to which the cell is connected. The row selection circuitry is controlled by the potential on the row select line (one of row select lines RS1–RSN) coupled to the cell.

Figure 5:
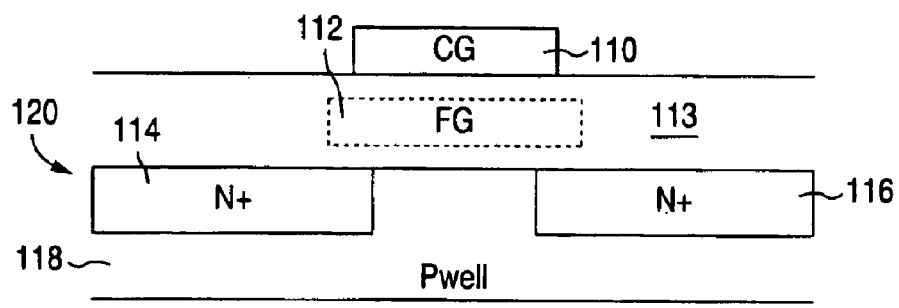
FIG. 5 is simplified side cross-sectional view of another embodiment of the inventive non-volatile memory cell.
Figure 6:
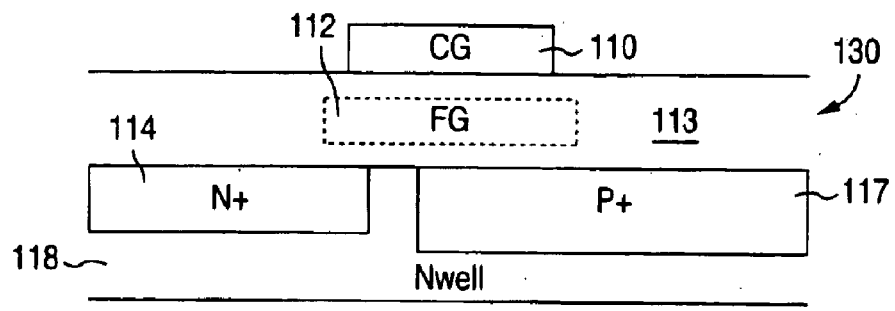
FIG. 6 is simplified side cross-sectional view of the memory cell of FIG. 5, in a plane parallel to the plane of FIG. 5.

Alternatively, each cell of the array includes (in place of PMOS transistor 20 and diode 30 of FIGS. 1–3) an NMOS readout transistor and a gated diode formed side-by-side in a P-well, with the NMOS readout transistor and diode sharing a source region (of N+ semiconductor material), a control gate, and a floating gate, and with the transistor's drain region (formed of N+ semiconductor material) coupled by a conductive drain contact to the diode's drain (formed of P+ semiconductor material). For example, each cell can have the structure shown in FIGS. 5 and 6, including a NMOS transistor 120 and a gated diode 130 formed side-by-side in a well 118 of P-type semiconductor material. Transistor 120 and diode 130 share source region 114 (consisting of N+ semiconductor material), control gate 110 (formed of polysilicon), floating gate 112 (also formed of polysilicon), and gate oxide 113. Drain region 116 of transistor 120 consists of N+ semiconductor material. Drain region 117 of diode 130 consists of P+ semiconductor material. Drain regions 116 and 117 are shorted together by an electrically conductive drain contact (not shown), and an electrically conductive source contact (not shown) is coupled to source region 114. Gate oxide 113 insulates control gate 110 and floating gate 112 from each other and from well 118, source region 114, and drain regions 116 and 117. The cell also includes row selection circuitry (not shown) coupled between the channel of transistor 120 and the column line to which the cell is coupled.

Figure 4:
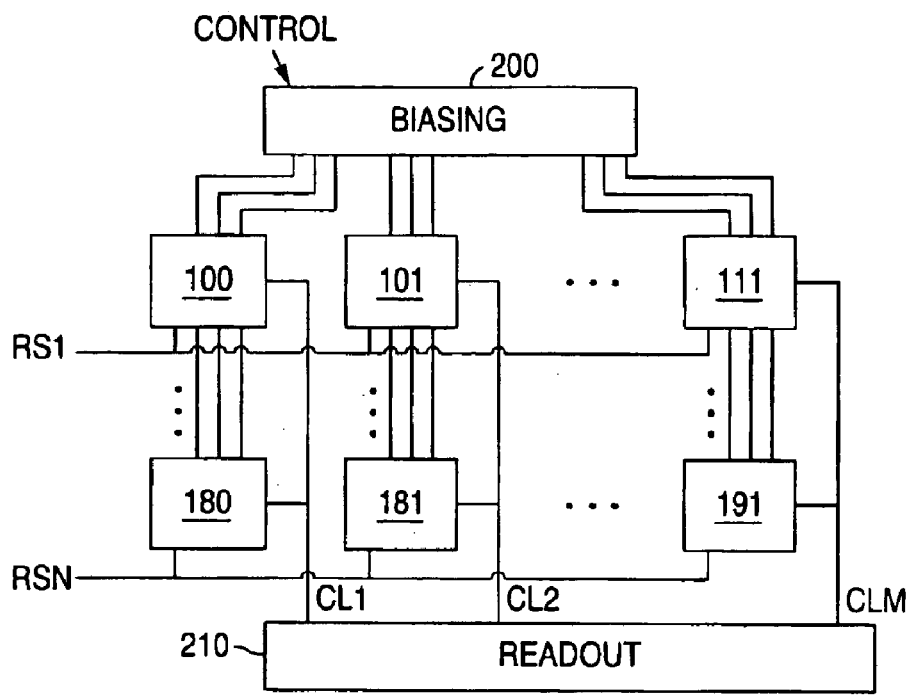
FIG. 4 is a simplified schematic diagram of a memory including an M×N array of non-volatile memory cells, wherein each of the cells is an embodiment of the inventive non-volatile memory cell.

With reference to FIG. 4, column line CL1 is coupled to cells 100 and 180 and to each other cell of the array's first column. Similarly, column line CL2 is coupled to cells 101 and 181 and to each other cell of the array's second column, column line CLM is coupled to cells 111 and 191 and each other cell of the array's Mth column, and other column lines are coupled to the cells of the other columns of the array.

Row select line RS1 is coupled to each of cells 100, 101, 111, and to each other cell of the array's first row. Similarly, row select line RSN is coupled to each of cells 180, 181, 191, and to each other cell of the array's Nth row, and other row select lines are coupled to the cells of the other rows of the array. In response to a control voltage (e.g., a high voltage) asserted on the relevant one of row select lines RS1–RSN, the channel of each cell's readout transistor is coupled to the relevant one of column lines CL1–CLM. Each column line is coupled to readout circuitry 210.

Biasing circuitry 200 is coupled to the source, control gate, and drain contact of each cell. In response to control signals (identified as "CONTROL" signals in FIG. 4), circuitry 200 asserts appropriate biasing potentials to the control gate, source, and drain contact of each cell or each of a selected subset of the cells.

During a programming operation, biasing circuitry 200 biases the control gate, source, and drain contact of each selected one of the cells to establish electric fields that produce hot electrons (via the band-to-band tunneling mechanism and optionally also by impact ionization) near the p-n junction of the cell's gated diode and cause injection of these electrons into the cell's floating gate while reverse biasing the gated diode.

During a read operation, control voltages are asserted sequentially to row select lines RS1-RSN to allow readout circuitry 210 to sense sequentially the channel currents flowing through the readout transistors of the cells connected along each column line. During the channel current sensing operation, circuitry 200 biases the control gate, source, and drain contact of each cell to reverse bias the cell's gated diode and bias the cell's readout transistor so that substantial current flows through the readout transistor's channel to circuitry 210 if the readout transistor is in a programmed state, but so that no significant channel current flows through the readout transistor's channel to circuitry 210 if the readout transistor is not in a programmed state.

During an erase operation, biasing circuitry 200 biases the control gate, source, and drain contact of each cell of the array to establish electric fields that cause excess electrons in each cell's floating gate to tunnel away from the floating gate.

In preferred embodiments, the inventive non-volatile memory cell is implemented as an integrated circuit, and a memory including an array of the inventive non-volatile memory cells is also implemented an integrated circuit.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A non-volatile memory cell, including:
  a single readout transistor, wherein the readout transistor is an MOS transistor formed in a volume of semiconductor material of a first type; and
  a gated diode formed in the volume of semiconductor material, wherein the transistor and the diode share a source region, a control gate, and a floating gate, the diode has a p-n junction, the transistor has a drain region comprising semiconductor material of a second type, the diode has a drain region comprising semiconductor material of the first type.

2. The cell of claim 1, also including:
  an electrically conductive drain contact connecting the drain region of the diode with the drain region of the transistor.

3. The cell of claim 2, wherein the MOS transistor is formed side-by-side with the diode in the volume of semiconductor material so that the cell is programmable by biasing the control gate, the source region, and the drain contact to reverse bias the diode and establish electric fields that produce hot electrons near the p-n junction of the diode and cause injection of said electrons into the floating gate.

4. The cell of claim 3, wherein the source region is separated from the drain region of the transistor by a first distance, the source region is separated from the drain region of the diode by a second distance, and the second distance is less than the first distance.

5. The cell of claim 1, wherein the volume of semiconductor material is a well of N-type semiconductor material, the MOS transistor is a PMOS transistor formed side-by-side in the well with the gated diode, the drain region of the PMOS transistor comprises P+ semiconductor material, and the drain region of the diode comprises N+ semiconductor material.

6. The cell of claim 5, also including:
  an electrically conductive drain contact connecting the drain region of the diode with the drain region of the transistor.

7. The cell of claim 1, wherein the volume of semiconductor material is a well of P-type semiconductor material, the MOS transistor is an NMOS transistor formed side-by-side in the well with the gated diode, the drain region of the NMOS transistor comprises N+ semiconductor material, and the drain region of the diode comprises P+ semiconductor material.

8. The cell of claim 1, also including dielectric material around the floating gate, wherein the floating gate is positioned between the control gate, the source region, the drain region of the diode, and the drain region of the transistor, and the dielectric material insulates the floating gate from each of the control gate, the source region, the drain region of the diode, and the drain region of the transistor.

9. A method for using a non-volatile memory cell including a single readout transistor and a gated diode, wherein the readout transistor is an MOS transistor, the transistor and the diode are formed in a volume of semiconductor material of a first type, the transistor and the diode share a source region, a control gate, and a floating gate, the diode has a p-n junction, the transistor has a drain region comprising semiconductor material of a second type, the diode has a drain region comprising semiconductor material of the first type, and the cell also includes an electrically conductive drain contact connecting the drain region of the diode with the drain region of the transistor, said method including the step of:
  (a) programming the cell by biasing the control gate, the source region, and the drain contact so as to reverse bias the diode and establish electric fields that produce hot electrons near the p-n junction of the diode and cause injection of said electrons into the floating gate.

10. The method of claim 9, wherein the MOS transistor has a channel, a current $I_{Don}$ flows through the channel when the MOS transistor is fully on, and the control gate, the source region, and the drain contact are biased during step (a) such that current flow through the channel during step (a) is less than $(I_{Don})/100$.

11. The method of claim 9, wherein the MOS transistor has a channel and said method also includes the steps of:
  (b) biasing the control gate, the source region, and the drain contact so as to reverse bias the diode and cause a first current to flow through the channel if the transistor is in a programmed state but much less than the first current to flow through the channel if the transistor is not in a programmed state; and
  (c) while performing step (b), reading the cell by sensing current flow through the channel.

12. The method of claim 11, also including the step of:
  erasing the cell by biasing the control gate, the source region, and the drain contact so as to cause electrons stored in the floating gate to tunnel from said floating gate to at least one of the source region, the volume of semiconductor material, the drain region of the transistor, and the drain region of the diode.

13. The method of claim 9, also including the step of:
erasing the cell by biasing the control gate, the source region, and the drain contact so as to cause electrons stored in the floating gate to tunnel from said floating gate to at least one of the source region, the volume of semiconductor material, the drain region of the transistor, and the drain region of the diode.

14. A method for using a non-volatile memory cell including a single readout transistor and a gated diode, wherein the readout transistor is an MOS transistor, the transistor and the diode are formed in a volume of semiconductor material of a first type, the transistor and the diode share a source region, a control gate, and a floating gate, the transistor has a drain region comprising semiconductor material of a second type and a channel, the diode has a drain region comprising semiconductor material of the first type, and the cell also includes an electrically conductive drain contact connecting the drain region of the diode with the drain region of the transistor, said method including the steps of:

(a) biasing the control gate, the source region, and the drain contact so as to reverse bias the diode and cause a first current to flow through the channel if the transistor is in a programmed state but much less than the first current to flow through the channel if the transistor is not in a programmed state; and (b) while performing step (a), reading the cell by sensing current flow through the channel.

15. The method of claim 14, wherein the diode has a p-n junction and said method also includes the step of:

(c) programming the cell by biasing the control gate, the source region, and the drain contact so as to reverse bias the diode and establish electric fields that produce hot electrons near the p-n junction of the diode and cause injection of said electrons into the floating gate.

16. The method of claim 15, wherein a current $I_{Don}$ flows through the channel when the MOS transistor is fully on, and the control gate, the source region, and the drain contact are biased during step (c) such that current flow through the channel during step (c) is less than $(I_{Don})/100$.

17. The method of claim 14, also including the step of:
erasing the cell by biasing the control gate, the source region, and the drain contact so as to cause electrons stored in the floating gate to tunnel from said floating gate to at least one of the source region, the volume of semiconductor material, the drain region of the transistor, and the drain region of the diode.

18. A memory including an array of non-volatile memory cells, each of the cells including:
a single readout transistor, wherein the readout transistor is an MOS transistor formed in a volume of semiconductor material of a first type; and
a gated diode formed in the volume of semiconductor material, wherein the transistor and the diode share a source region, a control gate, and a floating gate, the diode has a p-n junction, the transistor has a drain region comprising semiconductor material of a second type, the diode has a drain region comprising semiconductor material of the first type.

19. The memory of claim 18, wherein each of the cells also includes:
an electrically conductive drain contact connecting the drain region of the diode with the drain region of the transistor.

20. The memory of claim 18, wherein the MOS transistor of each of the cells is formed side-by-side with the diode of said each of the cells in the volume of semiconductor material so that said each of the cells is programmable by biasing the control gate, the source region, and the drain contact to reverse bias the diode and establish electric fields that produce hot electrons near the p-n junction of the diode and cause injection of said electrons into the floating gate.

21. The memory of claim 18, wherein the source region of each of the cells is separated from the drain region of the transistor of said each of the cells by a first distance, the source region is separated from the drain region of the diode by a second distance, and the second distance is less than the first distance.

22. The memory of claim 18, wherein the volume of semiconductor material of each of the cells is a well of N-type semiconductor material, the MOS transistor of each of the cells is a PMOS transistor formed side-by-side in the well with the gated diode, the drain region of the PMOS transistor comprises P+ semiconductor material, and the drain region of the diode comprises N+ semiconductor material.

23. The memory of claim 18, wherein the volume of semiconductor material of each of the cells is a well of P-type semiconductor material, the MOS transistor of each of the cells is an NMOS transistor formed side-by-side in the well with the gated diode, the drain region of the NMOS transistor comprises N+ semiconductor material, and the drain region of the diode comprises P+ semiconductor material.

24. The memory of claim 18, wherein each of the cells also includes dielectric material around the floating gate, wherein the floating gate of said each of the cells is positioned between the control gate, the source region, the drain region of the diode, and the drain region of the transistor, and the dielectric material insulates the floating gate from each of the control gate, the source region, the drain region of the diode, and the drain region of the transistor.

25. The memory of claim 18, wherein the cells are arranged in rows along column lines, and the memory also includes:
biasing circuitry coupled to the source region, control gate, and drain contact of each of the cells; and
readout circuitry coupled to each of the column lines.

26. The memory of claim 25, wherein each of the cells also includes an
electrically conductive drain contact connecting the drain region of the diode of said cell with the drain region of the transistor of said cell,
the biasing circuitry is configured to assert a first set of biasing potentials to the control gate, the source region, and the drain contact of each of a selected subset of the cells to program each cell of said subset of the cells, and
the biasing circuitry is configured to assert a second set of biasing potentials to the control gate, the source region, and the drain contact of each of the cells to erase said each of the cells.

27. The memory of claim 26, wherein the first set of biasing potentials reverse biases the diode of each cell of said subset of the cells and establishes electric fields that produce hot electrons near the p-n junction of the diode of each cell of said subset and cause injection of said electrons into the floating gate of each cell of said subset.

28. The memory of claim 27, wherein the MOS transistor of each of the cells has a channel, a current $I_{Don}$ flows through the channel when the MOS transistor is fully on, and the first set of biasing potentials is such that current flow through the channel of each cell of said subset of the cells in response to the first set of biasing potentials is less than $(I_{Don})/100$.

29. The memory of claim 27, wherein the second set of biasing potentials causes electrons stored in the floating gate of said each of the cells to tunnel from said floating gate to at least one of the source region, the volume of semiconductor material, the drain region of the transistor, and the drain region of the diode of said each of the cells.

30. The memory of claim 26, wherein the biasing circuitry is configured to assert a third set of biasing potentials to the control gate, the source region, and the drain contact of each the cells, and the readout circuitry is configured to read out a sequence of subsets of the cells while the biasing circuitry asserts the third set of biasing potentials to the control gate, the source region, and the drain contact of each cell of said sequence.

31. The memory of claim 30, wherein the MOS transistor of each of the cells has a channel, and the third set of biasing potentials reverse biases the diode of each cell of said sequence and causes a first current to flow through the channel if the transistor is in a programmed state but much less than the first current to flow through the channel if the transistor is not in a programmed state.

* * * * *